United States Patent
Su et al.

(10) Patent No.: US 7,042,253 B2
(45) Date of Patent: May 9, 2006

(54) SELF-CALIBRATING, FAST-LOCKING FREQUENCY SYNTHESIZER

(75) Inventors: Chih-Chin Su, Taoyuan (TW);
Chao-Shiun Wang, Taoyuan (TW)

(73) Assignee: Industrial Technology Research Institute (ITRI), Hsinchu (TW)

( * ) Notice: Subject to any disclaimer, the term of this patent is extended or adjusted under 35 U.S.C. 154(b) by 0 days.

(21) Appl. No.: 10/853,596

(22) Filed: May 24, 2004

(65) Prior Publication Data

US 2005/0258906 A1 Nov. 24, 2005

(51) Int. Cl.
*H03L 7/00* (2006.01)

(52) U.S. Cl. ............................ 327/17; 327/11; 327/157

(58) Field of Classification Search ........ 327/156–158; 331/1 A, 10, 17, 11
See application file for complete search history.

(56) References Cited

U.S. PATENT DOCUMENTS 6,552,618 B1 * 4/2003 Nelson et al. ................. 331/11
6,806,781 B1 * 10/2004 Bisanti et al. ............. 331/36 R
2003/0197564 A1 * 10/2003 Humphreys et al. ........... 331/11

* cited by examiner

*Primary Examiner*—Dinh T. Le
(74) *Attorney, Agent, or Firm*—Philip K. Yu; East IP Group

(57) ABSTRACT

A frequency synthesizer for dual-band high frequency RF application. The frequency synthesizer first uses a frequency-locked loop circuit ("FLL") to achieve self-calibration and frequency-locking, and then uses a phase-locked loop circuit ("PLL") to achieve phase-locking. During the FLL, the PLL is de-activated by control signals from the digital control and state machine of the FLL. The varactor of the VCO is initially connected to a fixed voltage, thus isolating the varactor from the PLL. The FLL adjusts the VCO's capacitor array by varying the five binary control bits from the state machine and digital control, until frequency-locking and self-calibration is achieved. Then, those five binary weighting control bits are also fixed for the VCO. The PLL is then activated to perform a fine-tuning and phase-locking loop, where the varactor of the VCO is controlled by the signal from the charge pump and the low-pass filter.

17 Claims, 4 Drawing Sheets

SELF-CALIBRATING, FAST-LOCKING FREQUENCY SYNTHESIZER

RELATED APPLICATION

The present application is related to a pending U.S. application, entitled DUAL BAND TRANSCEIVER ARCHITECTURE FOR WIRELESS APPLICATION, filed on Nov. 17, 2003, Ser. No. 10/713,022, also assigned to the current Assignee. The present application is also related to a pending U.S. application, entitled "High Frequency Gain Amplifier with Phase Compensation Circuit," filed on even date hereof, Ser. No. 10/853,597, also assigned to the current Assignee. The content of the Related Applications are incorporated herein as if fully set forth herein.

FIELD OF THE INVENTION

The present invention generally relates to the synthesis of high-frequency signals, and more particularly to the synthesis of high-frequency local oscillator signals for wireless communication applications.

ART BACKGROUND

It has become quite common for wireless communication systems to require frequency synthesis in both the receive path circuitry and the transmit path circuitry. Such applications can be found in various communication fields. For example, cellular phone standards in the United States define a cellular telephone system with communication centered in two frequency bands at about 900 MHz and 1800 MHz. For example, U.S. cellular phone standards include (1) the AMPS (analog), IS-54(analog/digital), and IS-95 (analog/digital) standards in the 900 MHz frequency band, and (2) PCS (digital) standards in the 1800 MHz range. A dual-band cellular phone is capable of operating in both the 900 MHz frequency band and the 1800 MHz frequency band.

Recently, wireless local-area networks, or commonly called Wi-Fi, have become popular. For Wi-Fi applications based on the IEEE 802.11 a/b communication standards, a single frequency synthesizer has been used for a dual 802.11 a/b RF transceiver, as described in the aforementioned Related Application. To accommodate signals from both 2.4 GHz and 5 GHz ISM bands, a frequency synthesizer with a wider tuning range is desired.

A frequency synthesizer is conventionally implemented by a phase-locked loop circuit ("PLL"). Reference is now turned to FIG. 1, where a conventional PLL 10 is illustrated. As is well-known to those skilled in the art, PLL 10 will automatically adjust the phase of VCO output signal ("Vout") 125, and synchronize Vout 125 to reference signal ("Vref") 105. Frequency divider 130 divides the frequency and phase of Vout 125 by a factor. Phase detector 100 generates phase detector signal Vpd 107, of which the voltage level is proportional to the phase difference between Vref 105 and feedback signal ("Vfb") 106. Signal Vpd(t) 107 is then filtered by low-pass loop filter 110 having a transfer function F(s), such that the noise and high-frequency components in Vpd(t) are suppressed. The output signal, Vctrl 115 from low-pass loop filter 110 sets the frequency of Vout signals from VCO 120.

However, when the VCO of an RF transceiver is operated in a wider tuning range, it has become more susceptible to errors as a result of process control and temperature variation. As such, it is desirable to provide a frequency synthesizer with self-calibration to compensate for any errors due to process control and temperature variation.

Additionally, conventional VCO designs typically place a VCO's varactor outside of the integrated circuit ("IC") to take advantage of the varactor's wider and yet linear tuning range. To also accommodate an even wider tuning range, multiple sets of VCOs have been implemented. An example of such multiple VCO design can be found in the frequency synthesizer used in the digital video broadcast system's transceiver. Of course, the trade-off of such multiple VCO design is that the system now is less integrated.

In U.S. Pat. No. 6,388,536, issued to Welland on May 14, 2002, entitled METHOD AND APPARATUS FOR PROVIDING COARSE AND FINE TUNING CONTROL FOR SYNTHESIZING HIGH-FREQUENCY SIGNALS FOR WIRELESS COMMUNICATIONS, a frequency synthesizer is disclosed for use in dual-band, GSM/GPRS cellular phone applications. Such a frequency synthesizer is capable of providing three sets of different frequency synthesis, as well as self-calibration. However, the design is more complicated due to the complex circuitry involved.

Therefore, it is desirable to provide a single set of VCO with an integrated varactor, while achieving self-calibration and fast-locking of any desired frequency.

SUMMARY OF THE INVENTION

A frequency synthesizer for dual-band high frequency RF application is disclosed. The frequency synthesizer first uses a frequency-locked loop circuit ("FLL") to achieve self-calibration and frequency-locking, and then uses a phase-locked loop circuit ("PLL") to achieve phase-locking. During the FLL, the PLL is de-activated by control signals from the digital control and state machine of the FLL. The varactor of the VCO is also initially to a fixed voltage, thus isolating the varactor from the PLL. The FLL adjusts the VCO's capacitor array by varying the five binary control bits from the state machine and digital control, until frequency-locking and self-calibration is achieved. Then, those five binary weighting control bits are also fixed for the VCO. The PLL is then activated to perform a fine-tuning and phase-locking loop, where the varactor of the VCO is controlled by the signal from the charge pump and the low-pass filter.

DETAILED DESCRIPTION OF THE DRAWINGS

A self-calibrating, fast-locking frequency synthesizer is disclosed. In the following detailed description, numerous specific details are set forth to provide a full understanding of the present invention. It will be obvious, however, to one ordinarily skilled in the art that the present invention may be practiced without some of these specific details. In other instances, well-known structures and techniques have not been shown in detail so as to avoid unnecessarily obscuring the present invention. While the present invention is described with reference to a transceiver for the 2.4 GHz and 5 GHz ISM bandwidth commonly used for Wi-Fi, it should be apparent to those skilled in the art that the application of the present invention is not limited to only 802.11 a/b transceiver designs.

Figure 1:
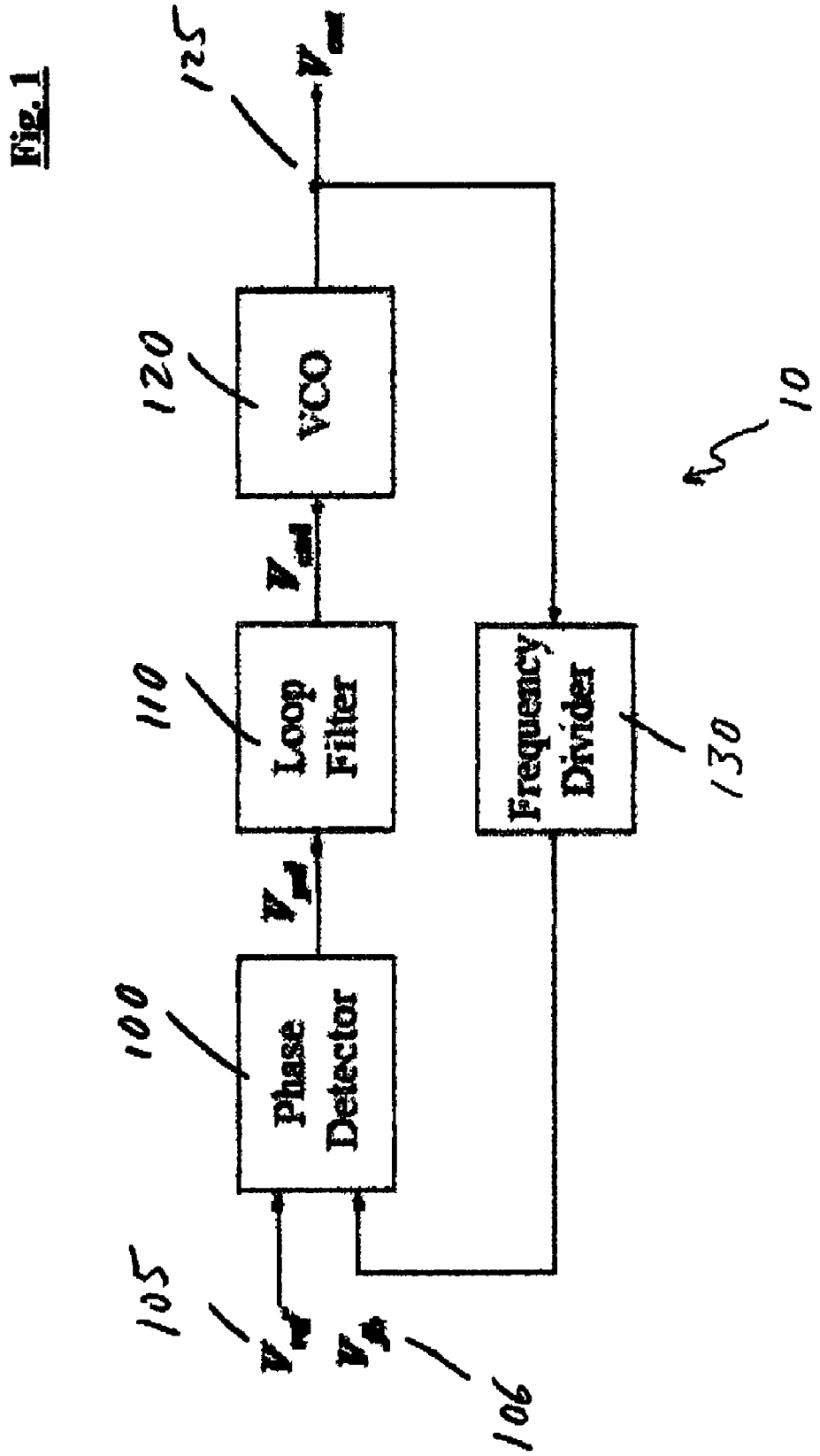
FIG. 1 illustrates a conventional phase-locked loop circuit.
Figure 2:
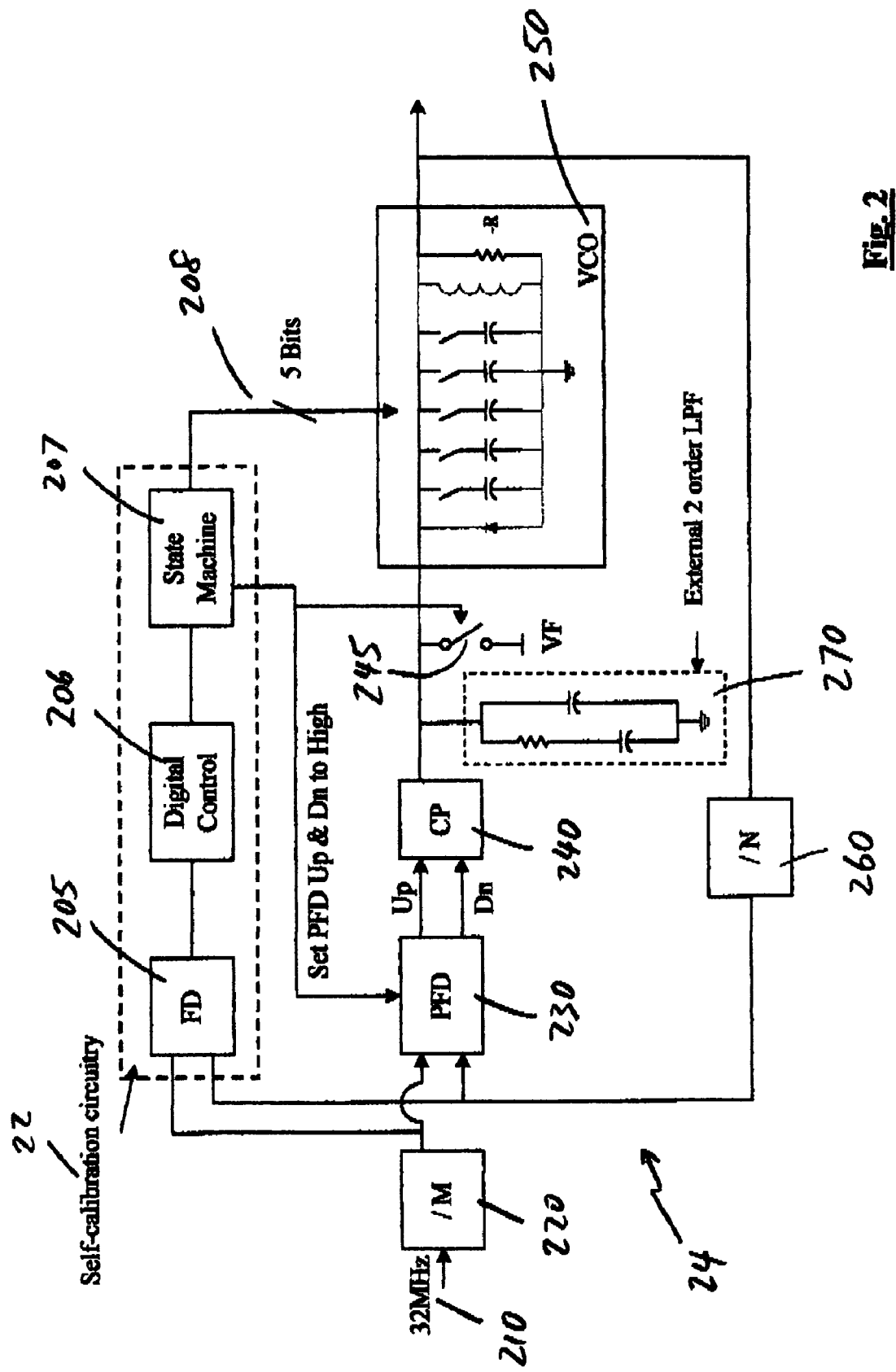
FIG. 2 is a simplified block diagram of an exemplary frequency synthesizer in accordance with the present invention.

Reference is now turned to FIG. 2, where a simplified block diagram of the frequency synthesizer 20 in accordance with the present invention is illustrated. Frequency synthesizer 20 comprises mainly two blocks: self-calibration circuitry 22 to provide coarse tuning, and PLL circuitry 24 to provide fine tuning. During coarse tuning, self-calibration circuitry 22 can achieve self-calibrating as in a frequency-locked loop ("FLL"). After frequency is locked in the desired range, the phase can then be locked using the fine tuning of PLL circuitry 24.

In self-calibration circuitry 22, frequency detector ("FD") 205 has its input terminals connected to the output terminals of first frequency divider ("/M divider") 220, and second frequency divider ("/N divider") 260. The output terminal of FD 205 is connected to the input terminal of digital control 206, which outputs to state machine 207. State machine 207, in turn, generates control signals to a capacitor array of VCO 250, to switch 245 and to phase frequency detector ("PFD") 230.

In PLL circuitry 24, the output terminal of /M divider 220 is also connected to one of the input terminals of phase/frequency detector ("PFD") 230. The other input terminal of PFD 230 is connected to the output terminal of /N divider 260. The outputs of PFD 230 are connected to the input terminals of charge pump 240. The output terminal of charge pump 240 is connected to a node, which is connected to external 2-order low-pass filter ("LPF") 270, switch 245 which is selectably connected to a fixed voltage VF, and a varactor (not shown) within VCO 250. Switch 245 is selectably controlled by one of the control signals generated by state machine 207.

Figure 3:
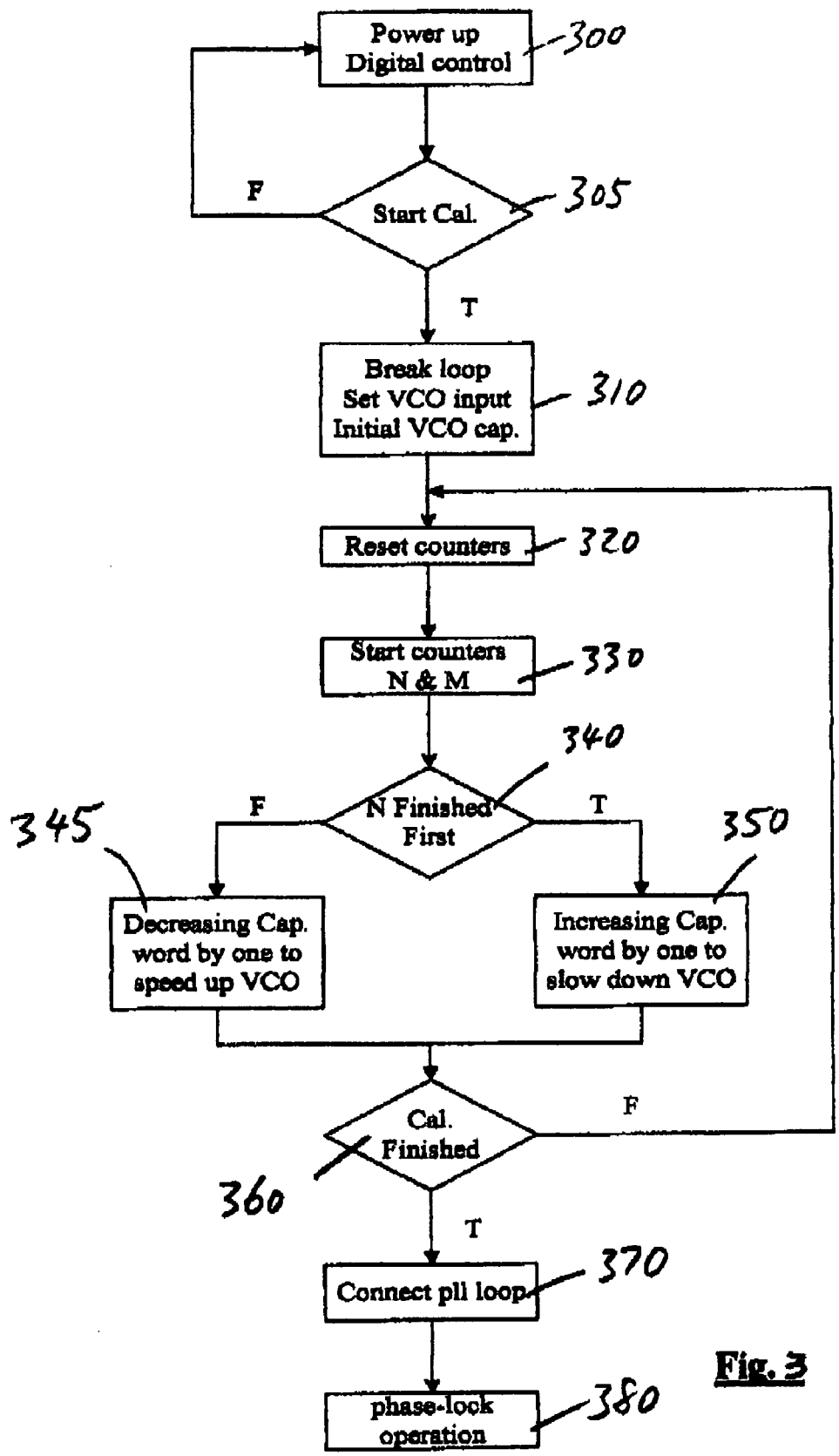
FIG. 3 is a simplified operational flow diagram of an exemplary frequency synthesizer in accordance with the present invention.

The operation of frequency synthesizer 20 in accordance with the present invention will now be described with reference to the flow chart in FIG. 3:

When the system is first powered up (Step 300), digital control determines whether calibration is to be performed. (Step 305).

If yes, self-calibration loop 22, or FLL, is activated by connecting a fixed voltage VF to the varactor of VCO 250, by switch 245. The capacitor array of VCO 250 is initialized by five binary weighting VCO control bits 208 from state machine 207. State machine 207 also sets the output terminals of PFD 230 to high, such that any effect of CP 240 and LPF 270 on the VCO is isolated. (Step 310).

Counters in frequency dividers 220, 260 are re-set and re-started. (Steps 320, 330). When /N divider 260 is finished first, the capacitance word of the 5 binary control bits 208 is increased by one to slow down VCO 250. If /N divider is not finished first, the capacitance word of the five binary control bits 208 is decreased by one to speed up VCO 250. (Steps 340, 345, 350). These steps (320, 330, 340, 345, 350) are repeated until calibration is finished (Step 360), where the input signals to FD 205 are closely synchronized with one another. At this point, the self-calibrating steps are completed with the five binary control bits initializing VCO 250 for the next stage, i.e. the PLL.

Now, the PLL circuitry 24 is activated after switch 245 disconnects fixed voltage VF from the input to the varactor of VCO 250. As such, the varactor can be further adjusted by CP 240 and LPF 270 to achieve phase-locking during this fine-tuning stage. (Steps 370, 380).

Figure 4:
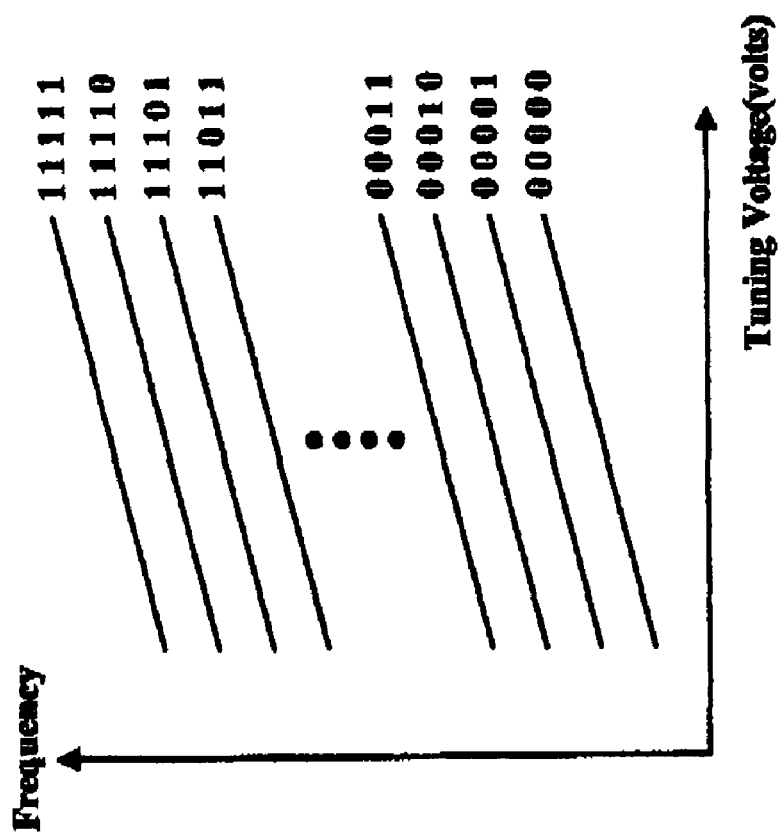
FIG. 4 illustrates the various exemplary frequency bands of the VCO that can be tuned by the five binary weighting control bits in accordance with the present invention.

FIG. 4 illustrates the various frequency bands of the VCO that can be tuned by the five binary weighting control bits. Note that each bit serves to connect one of the capacitors that are connected in parallel in the LRC network of the VCO. Different bit patterns can cause the VCO to have a different capacitance, thus affecting the output frequency of the VCO.

As described, the frequency synthesizer in accordance with the present invention first uses a frequency-locked loop to achieve self-calibration, and then uses a phase-locked loop to achieve phase-locking for the system. During the FLL, the PLL is de-activated by the control signals from the digital control and state machine of the FLL. The varactor of the VCO is also connected to a fixed voltage, thus isolating the varactor from the PLL. The FLL adjusts the VCO's capacitor array by varying the five binary control bits from the state machine and digital control, until coarse-tuning and frequency-locking is achieved. At such point, those five binary weighting control bits are also set for the VCO's coarse tuning. The PLL is then activated to perform a phase-locking loop for fine-tuning, where the varactor of the VCO is controlled by the signal from the charge pump and the low-pass filter.

Although the invention is described herein with reference to the preferred embodiment, one skilled in the art will readily appreciate that other applications may be substituted for those set forth herein without departing from the scope of the present invention. Accordingly, the invention should only be limited by the claims included below.

What is claimed is:

1. A frequency synthesizer having an input ("Vin") and at least one output ("Vout") with variable frequency, the output frequency varying as a capacitance within the frequency synthesizer varies, comprising:

a voltage-controlled oscillator ("VCO") integrated with said frequency synthesizer, said VCO generating said output with a variable frequency, said VCO having a discretely variable capacitance selectably controllable by a first control signal and a continuously variable capacitance selectably controllable by a second control signal;

a frequency-locked loop circuit ("FLL") integrated with said frequency synthesizer, said FLL receiving said Vin and generating said first control signal to said VCO, such that the frequency of said Vout approaches the frequency of said Vin;

a phase-locked loop circuit ("PLL") comprising said VCO, said PLL receiving said Vin and generating said second control signal, such that the phase of said Vout approaches the phase of said Vin, wherein:

said first control signal generated by said FLL is a multi-bit signal which controllably increments and decrements the capacitance of said VCO based on a relative comparison between said Vin and said Vout as to which one has a higher frequency;

said FLL generates a de-activate signal to de-activate a phase detector of said PLL to isolate said phase detector from said VCO while said FLL is operational by causing a fixed voltage to be applied to said variable capacitance of said VCO;

said PLL is activated to control said VCO after said FLL's operation.

2. The frequency synthesizer of claim 1, wherein said discretely variable capacitance of said VCO comprises a capacitor array, and said continuously variable capacitance of said VCO comprises a varactor.

3. The frequency synthesizer of claim 2, wherein said de-activate signal generated by said FLL also forces said second control signal from said PLL to a fixed voltage ("VF").

4. The frequency synthesizer of claim 3, wherein said FLL comprises:
a frequency detector, said frequency detector detecting a frequency comparison between said Vin and said Vout as to which one has a higher frequency;
a digital control coupled to said frequency detector;
a state machine coupled to said digital control, said state machine varying said first control signal, by one of incrementing and decrementing its bit value, to said VCO according to said frequency comparison, said state machine also generating said de-activate signal while said frequency difference is still greater than a predetermined value, said state machine also generates a third control signal to control said PLL.

5. A frequency synthesizer having an input ("Vin") and at least one output ("Vout") with variable frequency, the output frequency varying as a capacitance within the frequency synthesizer varies, comprising:
a VCO, generating said Vout based on a capacitance within said VCO, said VCO comprising a varactor and a capacitor array for varying the capacitance;
a first frequency divider ("/M"), receiving said Vin and generating a $1^{st}$ lower frequency signal;
a second frequency divider ("/N"), receiving said Vout and generating a $2^{nd}$ lower frequency signal;
a frequency detector ("FD"), receiving said $1^{st}$ and $2^{nd}$ signals and comparing frequencies between said $1^{st}$ and $2^{nd}$ frequency signals, said FD generating a FD detection signal corresponding to said frequency comparison;
a digital control and state machine, receiving said FD detection signal from said FD and generating a multi-bit binary control signal and a state control signal, said binary control signal adjusting said capacitor array of said VCO by one of incrementing and decrementing said binary control signal based on said frequency comparison between said $1^{st}$ and $2^{nd}$ lower frequency signals, said state control signal causing a fixed voltage ("VF") to be applied to said varactor of said VCO, until the frequency comparison is stabilized;
a phase/frequency detector ("PFD"), receiving said $1^{st}$ and $2^{nd}$ lower frequency signals and generating a PFD detection signal based on a phase difference between said $1^{st}$ and $2^{nd}$ signals, said PFD also receiving said state control signal from said digital control and state machine;
a charge pump, receiving said PFD detection signal and generating a CP control signal to control said varactor of said VCO when said state control signal from said digital control and state machine is not applied;
an external low-pass filter coupled to filter said CP control signal.

6. The frequency synthesizer of claim 5, wherein said digital control and state machine is disposed to set the PFD detection signal to a HIGH until the frequency difference is stabilized.

7. A frequency synthesizer having an input ("Vin") and at least one output ("Vout") with variable frequency, the output frequency varying as a capacitance within the frequency synthesizer varies, comprising:

a VCO, said VCO generating said Vout based on a capacitance within said VCO, said VCO comprising a varactor and a capacitor array for varying the capacitance within said VCO;
a first frequency divider, receiving said Vin and generating a frequency-divided Vin;
a second frequency divider, receiving said Vout and generating a frequency-divided Vout;
a calibration circuit, said calibration circuit generating a multi-bit control signal, which is controllably one of incremented and decremented to discretely vary said capacitor array of said VCO based on a frequency comparison between said frequency-divided Vout and Vin until the frequency comparison is within a predetermined range, said calibration circuit also generating a calibration control signal until the frequency comparison is with said range, said calibration control signal also switchably connecting said varactor to a fixed voltage source;
a PLL circuit comprising said VCO, said PLL circuit continuously varying said varactor of said VCO based on the phase difference between said frequency-divided Vout and Vin until the phase difference is within a predetermined range, a phase detector of said PLL remaining de-activated by said calibration control signal from said calibration circuit until the frequency difference is within said range and until said calibration control signal disconnecting said varactor from said fixed voltage.

8. The frequency synthesizer of claim 7, wherein said calibration circuit comprises:
frequency detector, receiving said frequency-divided Vin and said Vout and generating a detection signal corresponding to the frequency comparison between the frequency-divided Vout and Vin;
a digital control and state machine, receiving said detection signal and generating said calibration control signal and a multi-bit binary control signal to said capacitor array, said multi-bit binary control signal is one of incremented and decremented to discretely adjust said capacitance based on the frequency comparison.

9. The frequency synthesizer of claim 8, wherein said PLL circuit comprises:
a phase/frequency detector, receiving said frequency-divided Vin and Vout and generating a PFD detection signal, representative of the phase difference between said Vin and Vout, said phase/frequency detecting also receiving said calibration control signal from said digital control and state machine;
a charge pump, receiving said PFD detection signal and generating a CP signal;
a low-pass filter, filtering said CP signal;
a switch, selectably connected to said fixed voltage source.

10. The frequency synthesizer of claim 9, wherein said varactor is integrated within said VCO.

11. The frequency synthesizer of claim 10, wherein said low-pass filter is external to said PLL.

12. A method of synthesizing a frequency in a communications receiver, said communication receiver having an input ("Vin") and at least one output ("Vout") with variable frequency, the output frequency varying as a capacitance within the frequency synthesizer varies, comprising the steps of:
using a voltage-controlled oscillator ("VCO") integrated with said frequency synthesizer, said VCO generating said output with a variable frequency, said VCO having a discretely variable capacitance selectably controllable by a first control signal and a continuously variable capacitance selectably controllable by a second control signal;

using a frequency-locked loop circuit ("FLL") integrated with said frequency synthesizer, said FLL receiving said Vin and generating said first control signal to said VCO, such that the frequency of said Vout approaches the frequency of said Vin;

using a phase-locked loop circuit ("PLL"), said PLL comprising said VCO, said PLL receiving said Vin and generating said second control signal, such that the phase of said Vout approaches the phase of said Vin, wherein:

said first control signal generated by said FLL is a multi-bit signal which controllably increments and decrements the capacitance of said VCO based on a comparison of frequencies between said Vin and said Vout;

said step of using an FLL generates a de-activate signal to de-activate a phase detector of said PLL from said VCO while said FLL is operational, said de-activate signal causing a fixed voltage to be applied to said variable capacitance of said VCO;

said step of using an PLL is activated to control said VCO after said FLL's operation.

13. The method of claim 12, wherein said discretely variable capacitance of said VCO comprises a capacitor army, and said continuously variable capacitance of said VCO comprises a varactor.

14. The method of claim 13, wherein said de-activate signal generated by said FLL also forces said second control signal from said PLL to a fixed voltage ("VF").

15. The method of claim 14, wherein said step of using said FLL comprises:

using a frequency detector, said frequency detector detecting a frequency comparison between its inputs, said frequency comparison indicating which one of its inputs is faster;

using a digital control coupled to said frequency detector;

using a state machine coupled to said digital control, said state machine varying said first control signal, by one of incrementing and decrementing its bit value, to said VCO according to said frequency comparison, said state machine also generating said de-activate signal while said frequency comparison is still greater than a predetermined value.

16. A method of synthesizing frequency in a communications receiver, said receiver having an input ("Vin") and at least one output ("Vout") with variable frequency, the output frequency varying as a capacitance within the frequency synthesizer varies, the method comprising the steps of:

generating, using a VCO, said Vout based on a capacitance within said VCO, said VCO comprising a varactor and a capacitor array for varying the capacitance;

dividing said Vin and generating a $1^{st}$ lower frequency signal, using a first frequency divider ("/M"),;

dividing said Vout and generating a $2^{nd}$ lower frequency signal, using a second frequency divider ("/N");

detecting said $1^{st}$ and $2^{nd}$ signals and determining a frequency comparison between said $1^{st}$ lower and $2^{nd}$ lower signals, using a frequency detector ("FD"), said FD generating a FD detection signal corresponding to which one of said $1^{st}$ lower and $2^{nd}$ lower signals has a higher frequency;

receiving said FD detection signal from said FD and generating a multi-bit binary control signal and a state control signal, using a digital control and state machine, said binary control signal adjusting said capacitor array of said VCO by one of incrementing and decrementing said binary control signal based on said frequency comparison between said $1^{st}$ and $2^{nd}$ lower frequency signals, said state control signal causing a fixed voltage ("VF") to be applied to said varactor of said VCO, until the frequency difference is stabilized;

receiving said $1^{st}$ and $2^{nd}$ lower frequency signals and generating a PFD detection signal, using a phase/frequency detector ("PFD"), based on a phase difference between said $1^{st}$ and $2^{nd}$ signals;

receiving said PFD detection signal and generating a CP control signal to control said varactor of said VCO, using a charge pump, when said state control signal from said digital control and state machine is not applied;

filtering said CP control signal, using an external low-pass filter;

wherein said state control signal de-activates said PFD during said adjusting said capacitor array.

17. The method of claim 16, wherein said step of said digital control and state machine comprises setting the PFD detection signal to a HIGH until the frequency difference is stabilized.

* * * * *